(12) United States Patent  (10) Patent No.: US 7,368,371 B2
Wu  (45) Date of Patent: May 6, 2008

(54) SILICON CARBIDE SCHOTTKY DIODE AND METHOD OF MAKING THE SAME

(75) Inventor: Shye-Lin Wu, Hsinchu Hsien (TW)

(73) Assignee: Chip Integration Tech. Co., Ltd., Hsinchu Hsien (TW)

( * ) Notice: Subject to any disclaimer, the term of this patent is extended or adjusted under 35 U.S.C. 154(b) by 0 days.

(21) Appl. No.: 11/453,801

(22) Filed: Jun. 16, 2006

(65) Prior Publication Data

US 2007/0293001 A1    Dec. 20, 2007

(51) Int. Cl.
*H01L 21/28* (2006.01)
*H01L 21/44* (2006.01)

(52) U.S. Cl. ............... 438/570; 438/571; 438/581; 257/E21.047

(58) Field of Classification Search ............... 438/570, 438/571, 581; 257/E21.047
See application file for complete search history.

(56) References Cited

U.S. PATENT DOCUMENTS

2006/0006394 A1\* 1/2006 Kordina .................. 257/77

\* cited by examiner

*Primary Examiner*—Michael Lebentritt
*Assistant Examiner*—Seahvosh Nikmanesh
(74) *Attorney, Agent, or Firm*—Birch, Stewart, Kolasch & Birch, LLP

(57) ABSTRACT

A method of forming silicon carbide Schottky diode is disclosed. The processes required two photo-masks only. The processes are as follows: firstly, an n+-silicon carbide substrate having an n– silicon carbide drift layer is provided. Then a silicon layer is formed on the drift layer. An ion implant is carried out to dope the silicon layer. Afterward the doped silicon layer is patterned to define an active region. A thermal oxidation is then followed to form a thick oxide layer by oxidizing the silicon layer and form guard rings by using the doped silicon layer as a diffused source. The thin oxide layer on the drift layer is then removed by dilute HF dip or by BOE (buffer oxide etching) solution dip. Thereafter, a top metal layer is deposited and patterned to define as anode. After a backside layer removal, a metal layer served as cathode is formed.

5 Claims, 3 Drawing Sheets

SILICON CARBIDE SCHOTTKY DIODE AND METHOD OF MAKING THE SAME

FIELD OF THE INVENTION

The present invention relates to a semiconductor device, specifically, to a silicon carbide Schottky diode device forming method, whose formation processes require only two photo masks.

BACKGROUND OF THE INVENTION

Currently, in the power device market, power transistors with breakdown voltage over 100V are mostly occupied by silicon base insulated gate bipolar transistor (IGBT). However, owing to the bipolar carriers characteristic of IGBT devices, the devices will suffer problems of the lifetime of the minority carriers while switching the device Consequently, if it is not possible to add lifetime killers in—during manufacturing, the system having IGBT devices would have to tolerate the power consumption and time waste while—switching IGBT devices.

By contrast, silicon base metal oxide semiconductor field transistors have a with mono-carrier species, and as a result, provide faster switch speed and less extra power consumption than those bipolar IGBTs. This is because silicon carbide has a large energy band gap of about 3.26 eV, a high critical breakdown electric field intensity and a high conductivity (4.9 W/cm-k) and is envisioned as an excellent material for the power transistor. The power transistor based on silicon carbide can achieve a breakdown voltage of 1000V without suffering any difficulty. The breakage voltage can even come up to 5 kV if the epi-layer thickness is appropriately adjusted.

Thus, it is desired to develop a silicon carbide base power transistor replacement for silicon IGBT or Schottky barrier diodes.

FIG. 6 shows an elementary structure of a Schottky diode. The structure includes a heavily-doped n-type substrate 10, an n-type epitaxial layer 20 properly doped to have the desired Schottky threshold and a silicon oxide 25 having a window for forming a Schottky contact, which is formed of a top metal layer 50. The cathode electrode 70 is formed on the rear surface of the substrate 10.

Such a structure, however, has a very poor breakdown voltage. Indeed, the equipotential surfaces tend to curve up to rise back to the surface. As a result, the curved areas of the equipotential surfaces, have very strong field variations that limit the possible reverse breakdown voltage.

A modified structure is shown in FIG. 7, in which peripheral p+ guard rings 60 are formed at the periphery of the Schottky diode area. To form the p+ guard rings 60, an additional oxide layer 30 is formed. As a result, the equipotential surfaces must pass in volume under the p regions and thus have a less pronounced curvature. This considerably improves the voltage withstand of the diode. However, the p-type guard ring cannot be made in a structure formed on a silicon carbide substrate. In fact, a diffusion annealing for a p-type dopant would require temperatures on the order of 1700° C., which raises acute technological problems.

An object of the present is thus to provide a method to overcome above problem.

SUMMARY OF THE INVENTION

The present invention discloses a structure of silicon carbide (SiC) Schottky diode and a method of making the same. The processes required two photo-masks only. The processes are as follows: firstly, an n+-silicon carbide substrate having an n− silicon carbide drift layer is provided. Then a silicon layer is formed on the drift layer. An ion implant is carried out to dope the silicon layer. Afterward the doped silicon layer is patterned (a first photo mask) to define an active region. A thermal oxidation is then followed to form a thick oxide layer by oxidizing the silicon layer and form guard rings by using the doped silicon layer as a diffused source. The thin oxide layer on the drift layer is then removed by dilute HF dip or by BOE (buffer oxide etching) solution dip. Thereafter, a top metal layer is deposited and patterned (a second photo mask) to define an anode. After a backside layer removal, a metal layer serving as cathode is formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The method of forming Schottky diode according to the present invention is shown in cross-sectional views from FIG. 1 to FIG. 4.

Figure 1:
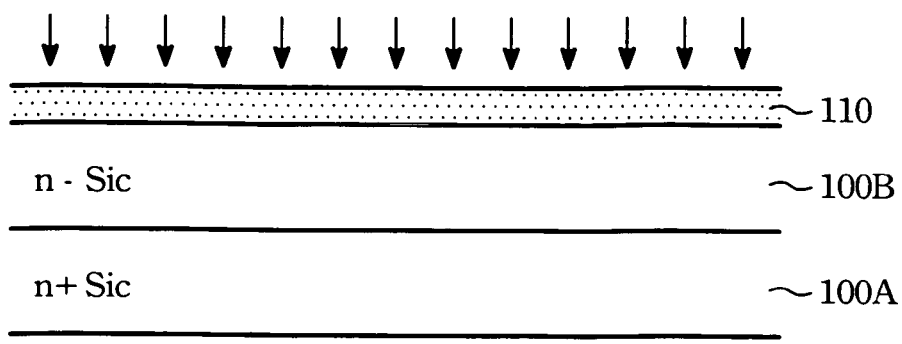
FIG. 1 is a cross-sectional view of forming a silicon layer on the n− silicon carbide epi-layer and then performing an ion implant in accordance with the present invention.

Referring to FIG. 1, an n-type impurity heavily doped silicon carbide substrate 100A has an n-type impurity doped silicon carbide epi-layer 100B formed thereon is prepared. The epi-layer 100B functions as a drift layer 100B. An un-doped silicon layer 110 is then deposited on epi-layer 100B. The silicon layer can be selected from polycrystalline silicon or amorphous silicon.

Thereafter, an ion implantation is performed using p-type ion species to dope the silicon layer 110. The p-type ion species can be $B^+$ or $BF_2^+$, aluminum ions, gallium ions, or indium ions.

Figure 2:
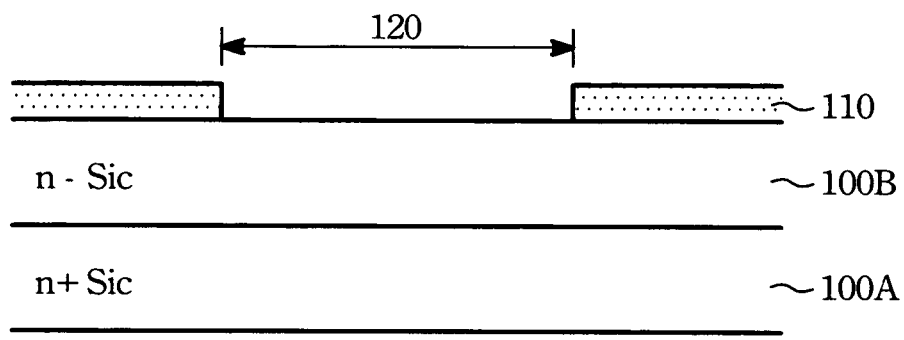
FIG. 2 is a cross-sectional view of defining an active region by patterning the silicon layer in accordance with the present invention.
Figure 3:
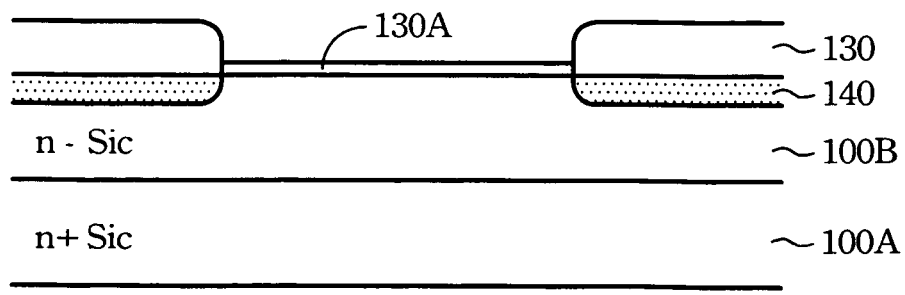
FIG. 3 is a cross-sectional view of performing a thermal oxidation to oxidize the silicon layer and drive in the impurities in accordance with the present invention.

Referring to FIG. 2, a patterning process to define an active region 120 is then followed by a lithographic and wet etching or dry etching of the silicon layer 110 until the drift layer 100B is exposed. Refering to FIG. 3, a thermal annealing process is conducted to form polyoxide layer 130 by oxidizing the silicon layer 110. During the process, a shallow p-type region 140 is formed in the n− drift layer 100B by using the p-type conductive impurities in the silicon layer 110 as a diffusion source. The shallow p-type region 140 serves as guard rings 140 and the oxide layer surrounding the active region serves as termination regions.

Since silicon carbide is known to be harder to oxidize than the silicon, at typical silicon oxidation temperatures for appropriate annealing times, only a very thin oxide layer 130A is formed on the exposed silicon carbide (n– drift layer 100B). For instance, a silicon carbide oxidation temperature is typically at a temperature between about 1400-1600° C. whereas a typical oxidation temperature of silicon is between about 900-1050° C. only. A removal of the thin oxide layer 130A is then performed by using a dilute HF or buffer oxide etching solution.

Figure 4:
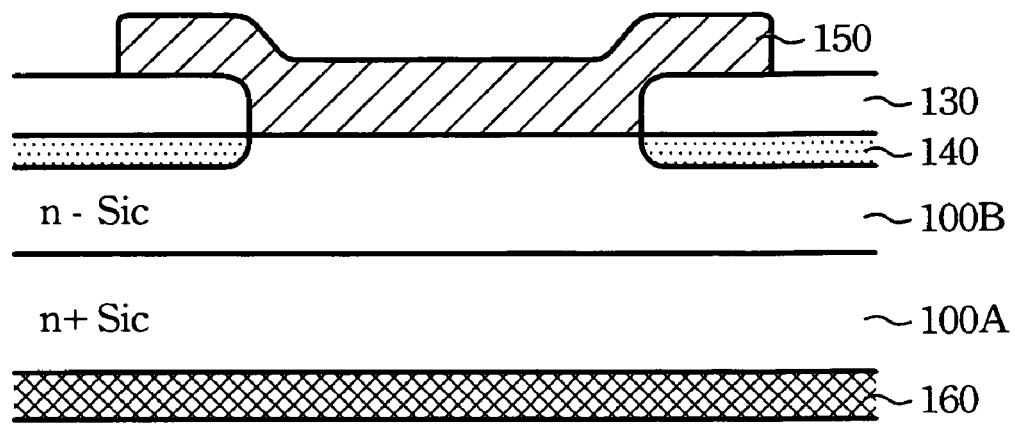
FIG. 4 is a cross-sectional view of forming the anode electrode by depositing a top metal layer and patterning and then forming the backside metal layer.

Referring to FIG. 4, a top metal layer 150 is then formed on the entire area. The material of the top metal layer 150 is chosen, for example, from Al, AlCu, AlSiCu, Ti/Ni/Ag, Ti, TiN, and refractory metal silicide, such as $TiSi_x$, $CoSi_x$, $NiSi_x$ etc. An anode electrode 150 defining step by patterning the top metal layer 150 is then conducted. After a backside material milling process by a chemical/mechanical polish to expose and thin the n+ silicon carbide substrate 100A, a backside metal layer 160 is formed thereafter as a cathode electrode.

Figure 5:
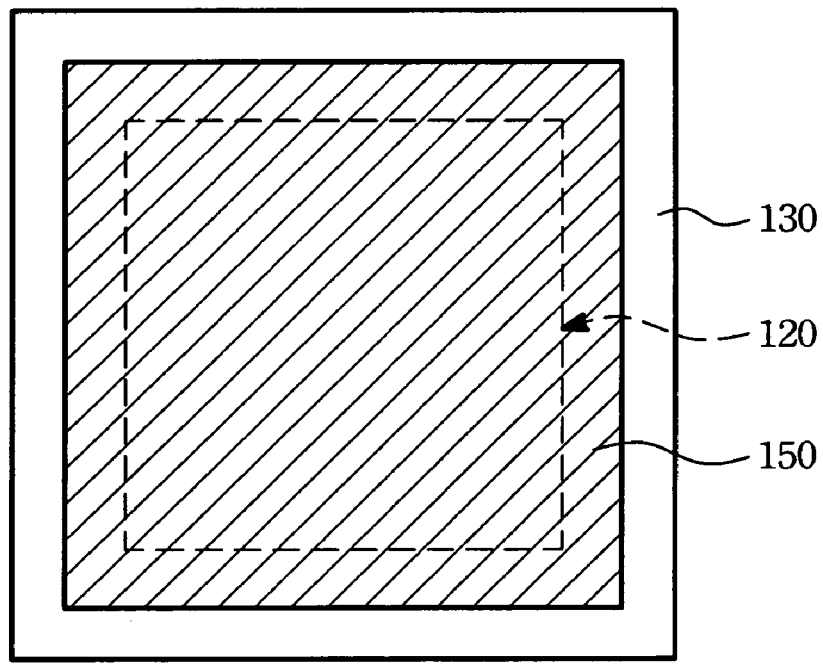
FIG. 5 is a top view showing the silicon carbide Schottky diode in accordance with the present invention.
Figure 6:
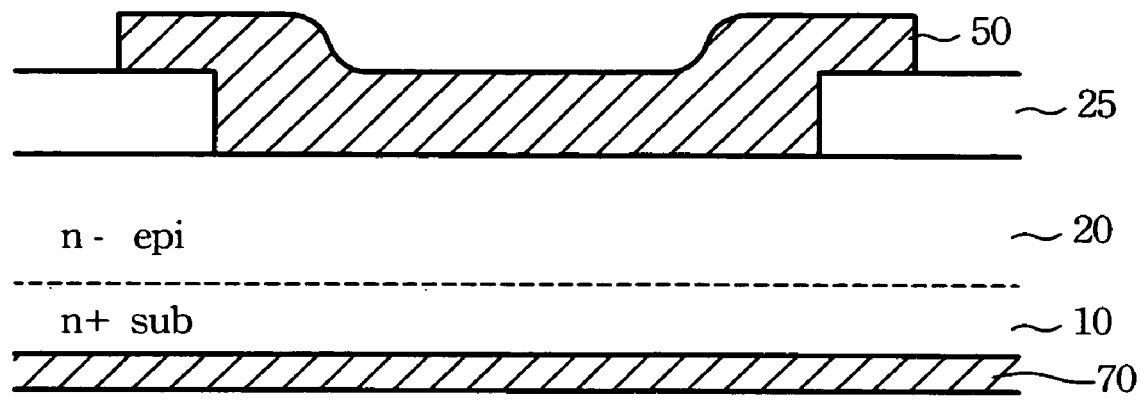
FIG. 6 is a cross-sectional view of an elementary structure of a Schottky diode in accordance with the prior art.
Figure 7:
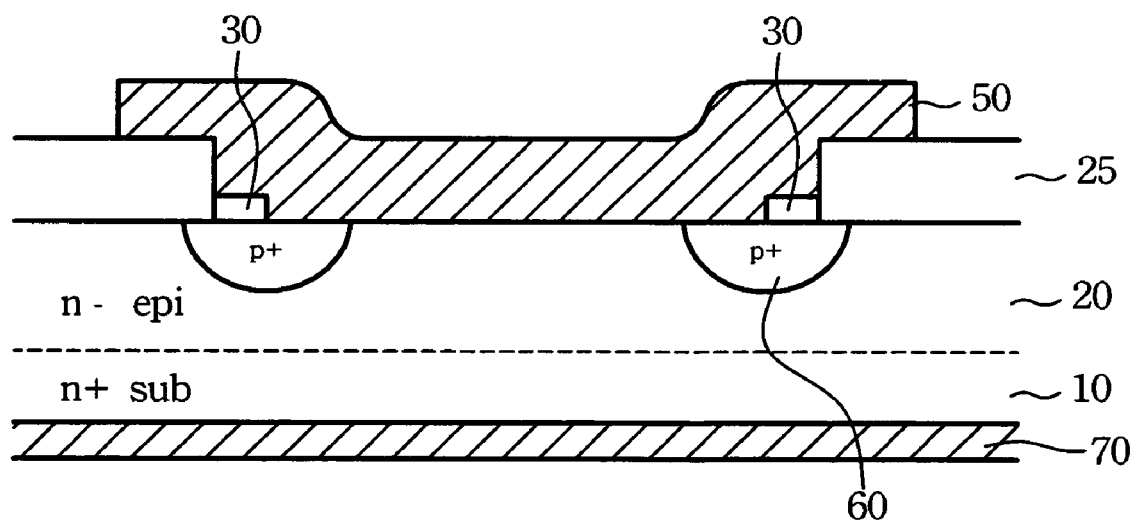
FIG. 7 is a cross-sectional view of a modified Schottky diode structure in accordance with the prior art.

The top view of the Schottky diode is shown in FIG. 5. For cutting a silicon carbide wafer into Schottky device dies, the top metal layer can provide good contrast.

The benefits of this invention are as follows:
(1) Only two photo-masks are required. Thus the invention provides processes of low cost.
(2) Thicker oxide film served as passivative layer and as termination region can enhance breakdown voltage and reduce leakage current.
(3) The device provides high breakdown voltage and lower Ron, sp and thus electron mobility performance can keep above a mean level.
(4) The p+ guard rings can enhance breakdown voltage and reduce reverse current.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A method of forming silicon carbide Schottky diode, the method comprising the steps of:
   providing a silicon carbide substrate with a first conductive impurity heavily doped and having a silicon carbide drift layer with said first conductive impurity doped formed thereon;
   forming a silicon layer on said drift layer;
   performing an ion implant using second conductive impurities as ion species to doped said silicon layer;
   patterning said silicon layer to define an active region where said drift layer is exposed;
   performing a thermal oxidation to form a thick oxide layer by oxidizing said silicon layer, form a thin oxide layer by oxidizing said drift layer of exposed portion and forming guard rings by driving in said second conductive impurities using said silicon layer as an impurity diffusion source;
   performing a dip-etching to remove said thin oxide layer to bare said drift layer
   forming a top metal layer on said thick oxide layer and said bared drift layer;
   patterning said top metal layer to form anode electrode; and
   removing all layers formed on a rear surface of said silicon carbide substrate until said silicon carbide substrate is exposed; and
   forming a backside metal layer on said rear surface to be as a cathode electrode.

2. The method of claim 1 wherein said silicon layer is selected from the group consisting of amorphous silicon and polycrystalline silicon.

3. The method of claim 1 wherein said first conductive impurities are nitrogen ions and said second conductive impurities are selected from boron ions, $BF_2^+$, Aluminum ions, Gallium ions, or Indium ions.

4. The method of claim 1 wherein said step of performing a thermal anneal is carried out at a temperature of 900-1050° C.

5. The method of claim 1 wherein said step of dip-etching is performed by using a dilute HF or a BOE (buffer oxide etching) solution.

* * * * *